73-654 SR

XR 2,904,681

SEARCH ROOM

CROSS REFERENCE

INVENTORS

John L. Jones, Jr.

Lloyd D. Anderson

2904681
OR IN 324/209

INVENTORS
John L. Jones, Jr.
Lloyd D. Anderson

EQUIVALENT CIRCUIT OF FEEDBACK
AMPLIFIER OVER THE OPERATING FREQUENCY RANGE

FREQUENCY RESPONSE CHARACTERISTICS OF THE
FEEDBACK AMPLIFIER

INVENTORS
John L. Jones, Jr.
Lloyd D. Anderson

INVENTORS
John L. Jones Jr.
Lloyd D. Anderson

INVENTORS
John L. Jones Jr.
Lloyd D. Anderson

United States Patent Office 2,904,681

Patented Sept. 15, 1959

2,904,681

FEEDBACK AMPLIFIER FOR EXTENDING THE USEFUL FREQUENCY RANGE OF AN ACCELEROMETER

John L. Jones, Jr., Silver Spring, and Lloyd D. Anderson, Takoma Park, Md.

Application September 15, 1954, Serial No. 456,192

9 Claims. (Cl. 250—27)

(Granted under Title 35, U.S. Code (1952), sec. 266)

The invention described herein may be manufactured and used by or for the Government of the United States of America for governmental purposes without the payment of any royalties thereon or therefor.

This invention relates to an electro-mechanical reproducing system for measurement and recording of acceleration and more particularly to a new and novel means for extending the useful frequency range of accelerometer pickup devices by combination with specially constructed negative feedback amplifiers.

More specifically the means involved includes an electrical circuit for picking up electric wave potentials, a feedback amplifier, an electrical analogue of the pickup comprising resistive, capacitive and inductive electrical circuit elements in a circuit configuration which forms the $\beta$ or return loop of the amplifier and a corrective circuit comprising suitable electrical circuit elements having predetermined optimum values which are so related to the constants of the accelerometer that the corrective effect provided thereby may be added in series with the output of the amplifier.

Accelerometer pickups employ a mass-spring mechanical system and their response reflects the characteristics of such a system. The basic characteristics required by an accelerometer device or system for distortionless transduction of mechanical shock intelligence into an electrical signal are a flat amplitude response and a linear phase response over the band width of the frequency spectrum of an applied acceleration pattern.

Until the development of the present device, the useful frequency range of systems heretofore or now in general use is limited to approximately .9 of the natural frequency of the accelerometer. In general, two methods of attacking the problem of obtaining good fidelity have been used in the past. The first method involves an attempt to provide the requisite characteristics of flat amplitude response and linear phase response with frequency by using a pickup, the natural frequency of which is several times as high as the highest significant frequency components present in the frequency spectrum of the applied acceleration. In the case of rapidly changing shocks, which are characterized by wideband frequency spectra, this is often not very practical because of the difficulties encountered in the design and construction of a transducer having a sufficiently high natural frequency. Another consideration which sometimes rules out this method is the fact that a high natural frequency can be attained only at the expense of sensitivity. The second method is to obtain a system response corresponding to optimum damping either by actually damping the accelerometer with a viscous fluid or eddy-current effects, or by using a specially designed electrical network with the accelerometer. Both of these methods are restricted to a frequency range not exceeding 0.9 of the natural frequency of the accelerometer.

The present invention permits the use of the combination of a feedback amplifier and an accelerometer in a novel circuit configuration displaying improved frequency response characteristics which effectively extends the useful frequency range up to several times its natural frequency. Good fidelity as characterized by a flat amplitude response and a linear phase response with frequency is maintained over the extended frequency range by the improved circuit combination of an accelerometer and feedback amplifier. The basic principles in the present application are evident when the well-known relationship $$E_R=\frac{\mu}{1-\mu\beta}E_0$$

representing the transmission characteristic of a feedback amplifier is written in the form $$E_R/E_0=[\mu\beta/(1-\mu\beta)][1/\beta]$$

In the frequency range where $\mu\beta$ is much larger than unity, the first factor on the right hand side of this equation is substantially unity in absolute value and it can be concluded that the gain of the amplifier varies inversely with the transmission through the $\beta$ circuit. Consequently, the combined response of an accelerometer and an amplifier utilizing a feedback circuit whose transmission characteristic is identical to that of the accelerometer would be flat over the frequency range where $\mu\beta$ is large. The deviation from the inverse relationship for the amplifier gain in the frequency range where $\mu\beta/(1-\mu\beta)$ is significantly different from unity is called the $\mu\beta$ effect. It can be shown by a mathematical analysis that as a result of the $\mu\beta$ effect, the combined response, instead of being flat, is identical to the response of another accelerometer having a higher natural frequency, $f_0$, and a smaller damping ratio than the actual accelerometer. This response is then corrected by an additional series circuit so that the overall response is equivalent to that of an accelerometer having a natural frequency, $f_0$, and optimum damping. The method developed here is effective with accelerometers having a response which can be simulated by a simple R–L–C series circuit over a frequency range up to a few times the natural frequency of the accelerometer. Theoretically, this is true for most types of accelerometers including both strain-gage and crystal types. However, accelerometers having high natural frequencies present practical difficulties because stray compliances produce spurious resonances within the frequency range of interest. In the instant case, an unbonded wire strain gage accelerometer having a natural frequency of 220 cycles per second was selected. This accelerometer is known commercially as a Statham R–12–120 accelerometer as manufactured by the Statham Laboratories, Los Angeles, California.

A broad object of this invention resides in providing a higher useful frequency range for an accelerometer.

Another object resides in the provision of an R–L–C analogue circuit of the pickup in a feedback loop of the amplifier of an improved system.

It is also an object of this invention to provide an amplitude vs. frequency correction network which can be connected in series relation with the amplifier output to further correct the damping characteristics of a system combining the instant feedback amplifier and accelerometer.

Another object resides in the provision of an improved accelerometer and feedback amplifier system which overcomes all of the foregoing difficulties encountered with devices of a related nature heretofore or now in general use.

Still other objects of the present invention are those inherent in the novel construction, combination, configuration or arrangement of parts which will become manifest as the description proceeds, and obviously certain modifications will become apparent without departing from the spirit and scope of the instant invention wherein reference is made to the accompanying drawings wherein.

Figures 1, 2:
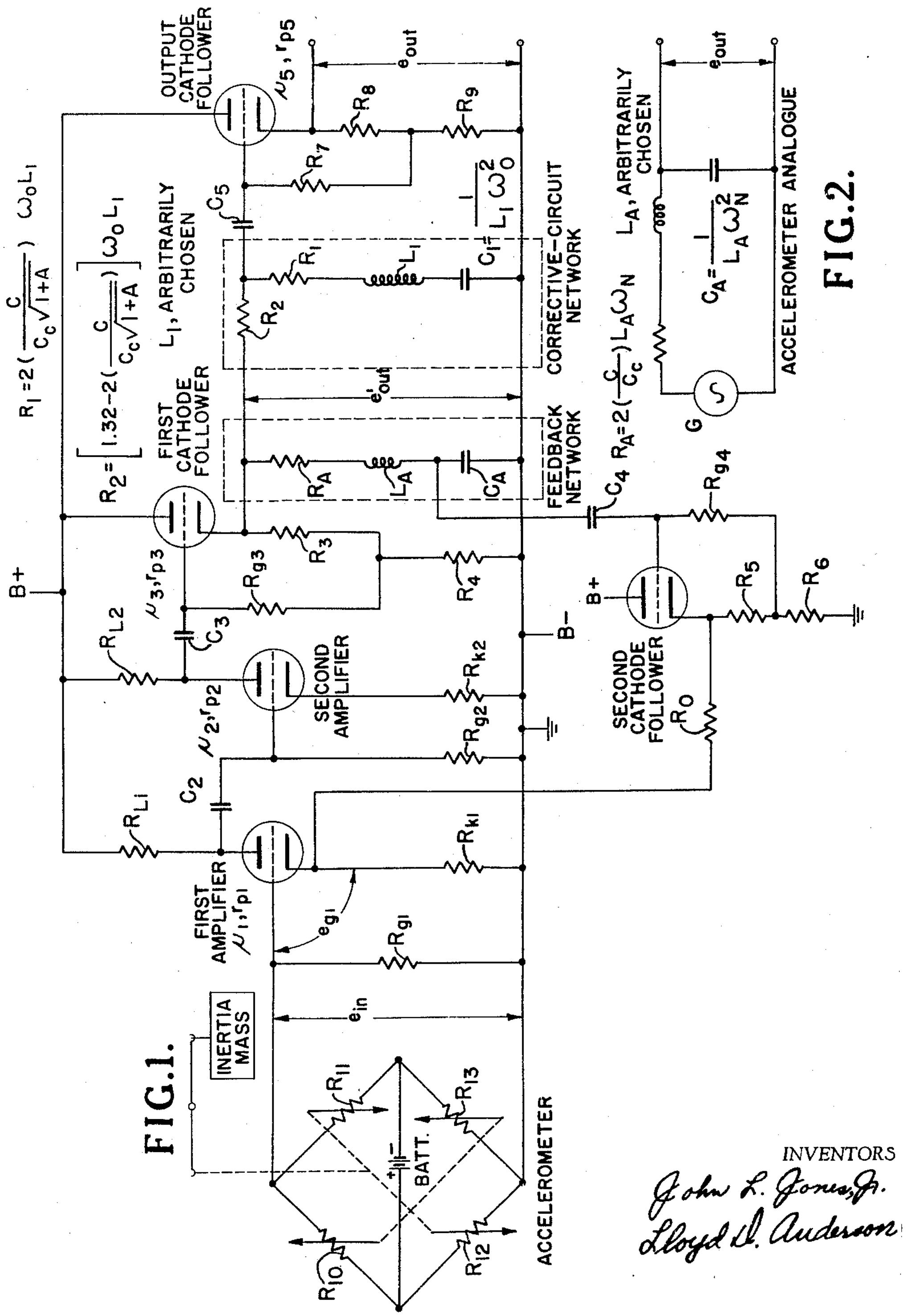
Fig. 1 is a circuit diagram of the combined accelerometer and feedback amplifier of a preferred embodiment of the instant invention.
Fig. 2 is a circuit diagram of the electrical analogue of an accelerometer.

Referring now to Fig. 1 of the drawings in which a schematic showing of the accelerometer and feedback amplifier of the instant device is shown to include four identical, unbonded, prestressed, strain-sensitive resistance wires $R_{10}$, $R_{11}$, $R_{12}$, and $R_{13}$ disposed in a balanced Wheatstone bridge and arranged in such a way that displacement of the inertia mass relative to the housing alternately increases the tension in one pair of oppositive arms of the bridge while simultaneously decreasing the tension in the other pair of opposite arms of the bridge. The bridge is energized from the D.-C. source indicated at Batt. with the output connected as shown to the signal grid of the first triode amplification stage $V_1$. The output of $V_1$ is resistance-capacitance coupled to a subsequent triode amplification stage $V_2$ in a manner to provide a predetermined time constant or frequency pass characteristic. The output at the plate of this second stage is coupled through a second predetermined time-constant network to the grid of a third stage $V_3$. Stage $V_3$ is connected as a cathode follower in a manner well known in the art. The output of the cathode follower $V_3$ derived across condenser $C_A$ of an analogue circuit hereinafter described in greater detail is coupled through $C_4$ to the grid of a second cathode follower stage $V_4$. The output across the cathode load resistor $R_5$ of $V_4$ is applied through resistance $R_0$ back to the cathode of $V_1$ and across the cathode impedance $R_K$. A second R–L–C network is connected across the cathode follower output of tube V3 and comprises the resistive elements $R_2$, $R_1$, $L_1$ and $C_1$ for a purpose hereinafter to be described in greater detail.

Referring now to Fig. 2 of the drawing, there is shown an analogue network of the accelerometer comprised of $R_A$, $L_A$ and $C_A$ for deriving the feedback voltage. The assumption that a steady-state vibration is applied to the accelerometer is the equivalent to assuming that a constant voltage generator G is used as the single generating source. The voltage derived across the condenser $C_A$ simulates the voltage developed by the accelerometer when a steady state vibration is applied. The accelerometer and $R_A$–$L_A$–$C_A$ network exhibit identical frequency response characteristics, hence the term analogue. When the analogue circuit is incorporated across the amplifier output stage, the alternating current output of the cathode follower tube $V_3$ is substituted as an equivalent for the single generating source. The voltage derived across the cathode of tube $V_3$ is applied to $R_A$, $L_A$ and $C_A$ in series. The signal voltage derived across $C_A$ of Fig. 1 is applied around the return loop of the feedback amplifier. The second filter network comprising elements $R_2$, $R_1$, $L_1$ and $C_1$ is a frequency correcting network designed to compensate for lack of proper damping resulting from the use of an uncorrected accelerometer and from the additional reduction in effective damping resulting from the use of the first filter in the output of the preceding circuitry.

A further description of the operation of the circuits of Fig. 1 and the analogue network will hereinafter become apparent when taken in consideration with the following described mathematical analysis of the system.

In the consideration of the operation of an accelerometer, hereinbefore mentioned instrument manufactured by Statham Laboratories is taken as an example. This instrument consists essentially of a housing enclosing an inertia mass which is suspended on cantilever springs. The housing is attached rigidly to the structure whose acceleration is to be measured and is filled with a viscous damping fluid. The housing and inertia mass are linked by four identical, unbonded, prestressed, strain-sensitive resistance wires. The wires are arranged in such a way that displacement of the inertia mass relative to the housing increases the tension in a first pair of the wires and simultaneously decreases the tension in the second pair. These two pairs of wires are electrically connected to form a Wheatstone bridge as shown by the input circuit of Fig. 1.

The differential equation determining the relative motion between the inertia mass, $m$, and the housing of an accelerometer consisting of a simple mass-spring system is:

$$m\ddot{y}+c\dot{y}+ky=ma(t)$$

or $$\ddot{y}+2(c/c_c)\omega_n\dot{y}+\omega_n^2y=a(t)$$

where $k$ is the spring constant,
$c$ is the coefficient of viscous damping
$m$ is the inertia mass
$y$ is the relative displacement between the inertia mass and the pickup housing
$a(t)$ is the component along the axis of sensitivity of the acceleration experienced by the pickup housing, $$\omega_n=\sqrt{\frac{k}{m}}$$

is the undamped natural circular frequency of the pickup, and $c_c=2m\omega_n$ is the critical damping.

Applying the Laplace Transformation (assuming zero initial conditions):

$$\bar{y}(p)=\frac{\bar{a}(p)}{p^2+2(c/c_c)\omega_np+\omega_n^2} \quad (2)$$

and since the output of the accelerometer is proportional to $y$ $$\bar{e}(p)=F\bar{y}(p)=\frac{F\bar{a}(p)}{p^2+2(c/c_c)\omega_np+\omega_n^2} \quad (3)$$

If a sinusoidal acceleration $a(t)=B\epsilon^{j\omega t}$ is applied to the pickup housing $$\bar{a}(p)=B\int_0^\infty \epsilon^{-pt}\epsilon^{j\omega t}dt=\frac{B}{p-j\omega}$$

and Equation 3 becomes $$\bar{e}(p)=\frac{FB}{(p-j\omega)[p^2+2(c/c_c)\omega_np+\omega_n^2]} \quad (4)$$

Figure 3:
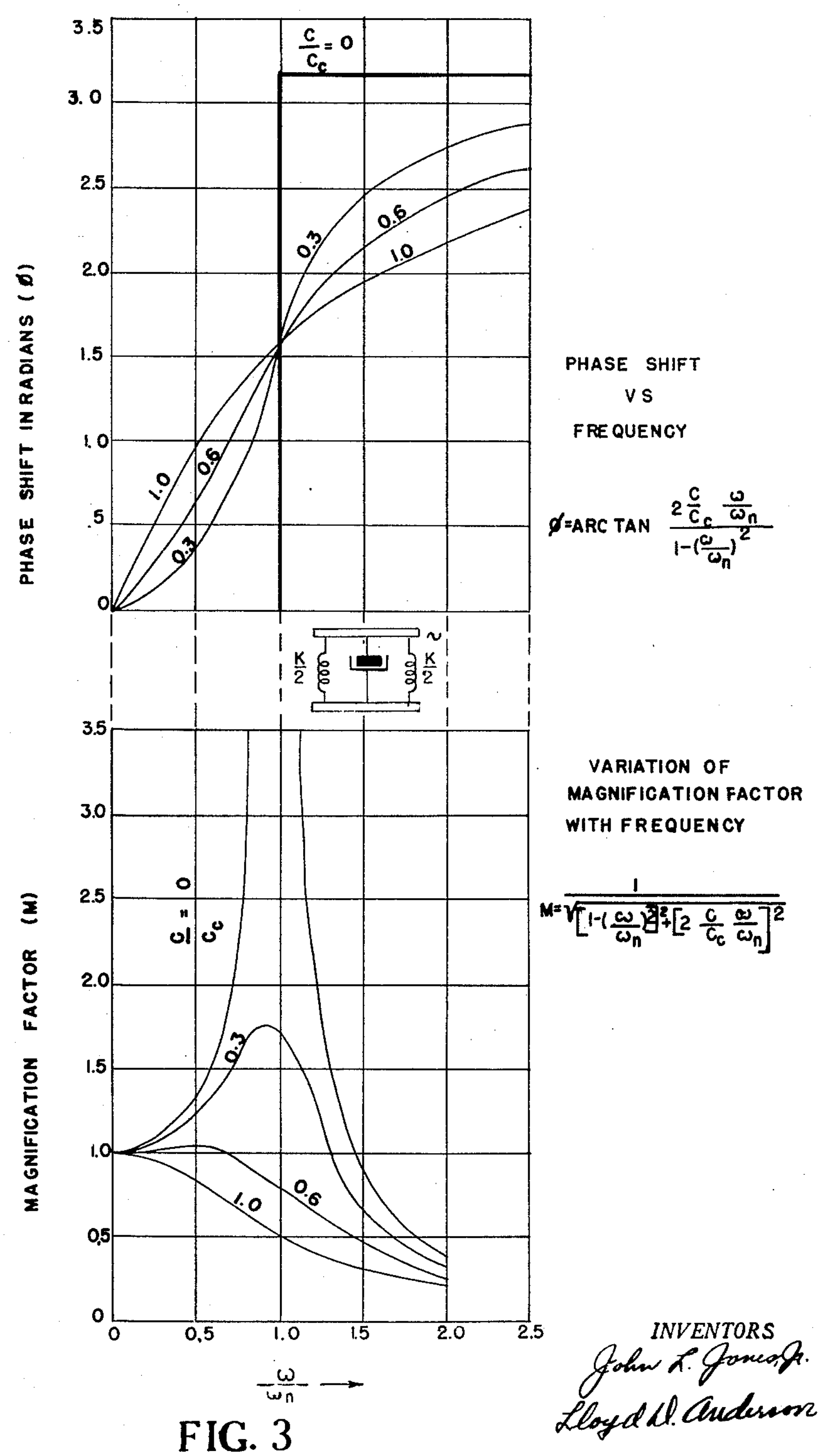
Fig. 3 is a set of curves showing the frequency characteristics of a viscously damped mass-spring system.

Transforming back to time-space, the steady-state solution is $$e(t)=\frac{FB}{\omega_n^2}\frac{\exp[j(\omega t-\varphi)]}{\sqrt{[1-(\omega/\omega_n)^2]^2+[2(c/c_c)(\omega/\omega_n)]^2}} \quad (5)$$

where $$\varphi=\arctan\frac{2(c/c_c)(\omega/\omega_n)}{1-(\omega/\omega_n)^2}$$

is the phase shift. The term $$\frac{1}{\sqrt{[1-(\omega/\omega_n)^2]^2+[2(c/c_c)(\omega/\omega_n)]^2}}$$

is called the magnification factor. Curves showing this factor and the phase shift as functions of frequency are presented in Fig. 3. These curves show that 60 percent of critical damping results in a very flat amplitude response while 80 percent of critical damping is about optimum for linear phase response. These two requirements conflict so that a compromise must be made. Sixty-six percent of critical damping has been considered optimum here.

Now consider the circuit of Fig. 2. The equation for this circuit can be written as:

$$\bar{e}_{out}=\frac{(1/pC_A)\bar{e}_{in}}{pL_A+R_A+1/pC_A}=\frac{\bar{e}_{in}}{L_AC_Ap^2+R_AC_Ap+1}$$
$$=\frac{\omega_n 2\bar{e}_{in}}{p^2+2(c/c_c)\omega_n p+\omega_n^2} \quad (6)$$

Comparison with Equation 3 shows that this circuit can be considered the equivalent circuit of an accelerometer which suggests using it in the feedback loop of a feedback amplifier to correct the response of an accelerometer.

Figure 4:
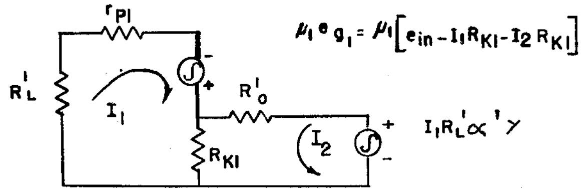
Fig. 4 is an equivalent circuit of the feedback amplifier over the operating frequency range.

Consider the feedback amplifier circuit shown as Fig. 1. Assume that the impedance of the network consisting of $R_2$, $R_1$, $L_1$ and $C_1$ is sufficiently high in value so that it has no appreciable loading effect and, consequently, can be ignored for the present. Let $$\gamma=\frac{1}{L_AC_Ap^2+R_AC_Ap+1}$$

represent the transmission of the $L_A$–$R_A$–$C_A$ circuit. Then, the equivalent circuit at intermediate frequencies may be drawn as shown in Fig. 4, where $R_L'$ is the resistance of the parallel combination of $R_{LI}$ and the input resistance of the second stage;

$R_0'=R_0+r_{p4}/\mu_4$ is the resistance of the feedback resistor, $R_0$ and the output resistance of the second cathode follower;

$\alpha_1$ is the gain of the second amplifier stage and the first cathode follower stage;

$\alpha_2$ is the gain of the second cathode follower stage;

$\alpha'$ is equal to $\alpha_1\alpha_2$, the overall gain of the second amplifier stage, the first cathode follower stage and the second cathode follower stage.

Other circuit constants are the same as shown on Fig. 1. Assuming zero initial conditions, the corresponding circuit equations in Laplace transform notation are:

$$\mu_1\bar{e}_{g1}=\mu_1\bar{e}_{in}-\mu_1\bar{I}_1R_{k1}-\mu_1\bar{I}_2R_{k1}$$
$$=(R_{k1}+r_{p1}+R_L')\bar{I}_1+R_k\bar{I}_2$$
$$\bar{I}_1R_L'\alpha'\gamma=R_{k1}\bar{I}_1+(R_{k1}+R_0')\bar{I}_2$$

Simplifying and solving for $\bar{I}_1$:

$$\bar{I}_1=\frac{\mu_1(R_{k1}+R_0')\bar{e}_{in}}{(R_{k1}+R_0')(R_L'+r_{p1})+(\mu_1+1)\alpha'\gamma R_{k1}R_L'+R_{k1}R_0'(\mu_1+1)} \quad (7)$$

Therefore $$\bar{e}'_{out}/\bar{e}_{in}=R_L'\alpha_1\bar{I}_1/\bar{e}_{in}=\frac{\mu_1}{\alpha 2(\mu_1+1)}\cdot\frac{R_{k1}+R_0'}{R_{k1}}\cdot\frac{A}{1+A\gamma} \quad (8)$$

Where $$A=\frac{R_{k1}R_L'\alpha'(\mu_1+1)}{(R_{k1}+R_0')(R_L'+r_{p1})+R_{k1}R_0'(\mu_1+1)} \quad (9)$$

Then $$\bar{e}'_{out}=\frac{\mu_1}{\alpha 2(\mu_1+1)}\cdot\frac{R_{k1}+R_0'}{R_{k1}}\cdot\frac{AF\bar{a}(p)}{p^2+2(c/c_c)(1/\sqrt{A+1})\omega_0 p+\omega_0^2} \quad (10)$$

where $$\omega_0=\omega_n\sqrt{A+1}$$

Comparison of Equation 10 with Equation 3 shows that the combined response of the amplifier (without the corrective network) and the accelerometer is identical to that of another accelerometer of undamped natural circular frequency $\omega_0=\sqrt{1+A}\omega_n$ and damping ratio $$(c/c_c)\ (1/\sqrt{A+1})$$

In any practical situation, this response will exhibit a pronounced peaking at $\omega_0$ since the effective damping $(c/c_c)\ (1/\sqrt{A+1})$ is very small. However, it will now be shown that the corrective circuit of Fig. 1 which has so far been ignored, effectively increases the damping to the optimum value so that this peaking is eliminated. The transmission of the $R_2$–$R_1$–$L_1$–$C_1$ circuit and the output cathode follower whose gain is $\alpha_3$ is:

$$\bar{e}_{out}=\frac{\alpha_3(L_1C_1p^2+R_1C_1p+1)}{L_1C_1p^2+(R_1+R_2)C_1p+1}\bar{e}'_{out} \quad (12)$$

which becomes $$\bar{e}_{out}=\frac{\alpha_3[p_2+2(c/c_c)(1/\sqrt{A+1})\omega_0 p+\omega_0^2]}{p^2+1.32\omega_0 p+\omega_0^2}\bar{e}'_{out} \quad (13)$$

when the values of the circuit elements in Fig. 1 are inserted. Then using Equation 10 we obtain:

$$\bar{e}_{out}=\frac{\alpha_3\mu_1}{\alpha_2(\mu_1+1)}\cdot\frac{R_{k1}+R_0'}{R_{k1}}\cdot\frac{AF\bar{a}(p)}{p^2+1.32\omega_0 p+\omega_0^2} \quad (14)$$

Hence, the overall response of the accelerometer and amplifier is identical to that of a 66 percent critically damped accelerometer with undamped natural circular frequency $\omega_0=\sqrt{A+1}\omega_n$.

Now consider the amplifier above. The transmission characteristic of the amplifier without the $R_2$–$R_1$–$L_1$–$C_1$ circuit is represented by Equation 8. This equation reduces to the form:

$$\frac{e'_{out}}{e_{in}}=KA\sqrt{\frac{[1-(\omega/\omega_n)^2]^2+[2(c/c_c)(\omega/\omega_n)]^2}{[1+A-(\omega/\omega_n)^2]^2+[2(c/c_c)(\omega/\omega_n)]^2}}\epsilon^{j\theta} \quad (15)$$

where $$K=\frac{\alpha_3\mu_1(R_{k1}+R_0')}{\alpha_2(\mu_1+1)R_{k1}}$$

and $$\theta=\arctan\frac{2(c/c_c)(\omega/\omega_n)}{1-(\omega/\omega_n)^2}-\arctan\frac{2(c/c_c)(\omega/\omega_n)}{1+A-(\omega/\omega_n)^2}$$

Figure 5:
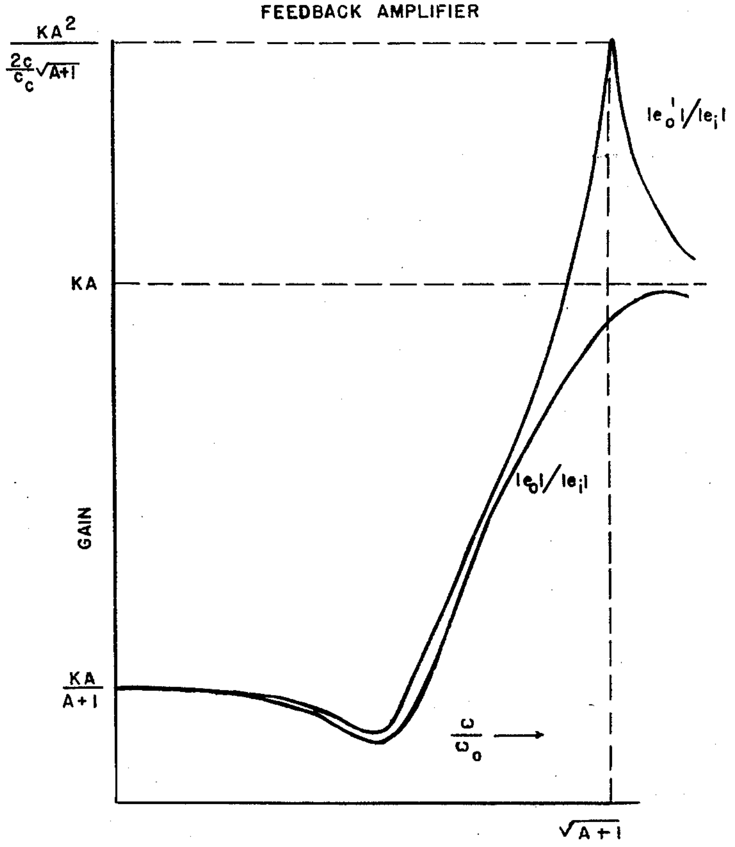
Fig. 5 is a set of curves showing the general frequency response characteristics of the feedback amplifier.

The gain represented by this equation is shown in Fig. 5. Equation 15 shows that the gain at low frequencies where $\omega/\omega_n<<1$ is $KA/(A+1)$ and that the gain at relatively high frequencies where $\omega/\omega_n>>A+1$ is KA. Thus, by maintaining the input voltage to the amplifier constant and measuring the output voltage, $e'_{out}$, at high frequencies and also at low frequencies, we can determine $A+1$ by taking the ratio of these two readings. The values of A and K can then be immediately determined. Another convenient means for determining the value of A is to determine the ratio of the peaking frequency to the frequency to which the feedback circuit is tuned. This ratio is equal to $\sqrt{A+1}$ as shown also in Fig. 5. The latter method is very practical since the peak in the frequency response is very sharp due to the small amount of damping and is especially useful when adjusting the amount of feedback. The amount of feedback determines the value of A and is adjusted by changing the value of the feedback resistor, designated $R_0$ in Fig. 1.

The transmission characteristic of the feedback amplifier including the corrective network as determined from Equations 10 and 13 is:

$$e_{out}/e_{in}=KA\sqrt{\frac{[1-(\omega/\omega_n)^2]^2+[2(c/c_c)(\omega/\omega_n)]^2}{[1+A-(\omega/\omega_n)^2]^2+[1.32\sqrt{A+1}(\omega/\omega_n)]^2}}\exp(j\psi) \quad (16)$$

where $$\psi=\arctan\frac{2(c/c_c)(\omega/\omega_n)}{1-(\omega/\omega_n)^2}-\arctan\frac{1.32\sqrt{A+1}(\omega/\omega_n)}{1+A-(\omega/\omega_n)^2}$$

and is also shown in Fig. 5.

It has been assumed that the $R_2$–$R_1$–$L_1$–$C_1$ circuit does not load the network appreciably. It has also been indicated that the values of $L_A$ and $L_1$ can be selected arbitrarily. However the magnitudes of $L_A$ and $L_1$ do affect the impedance levels. Consequently, to prevent loading, they should be selected judiciously. In general, the selection can be made readily since the output impedance of the cathode follower is the only element common to both networks and it is small. Furthermore, the fact that the two networks resonate at different frequencies tends toward further isolation.

Figure 6:
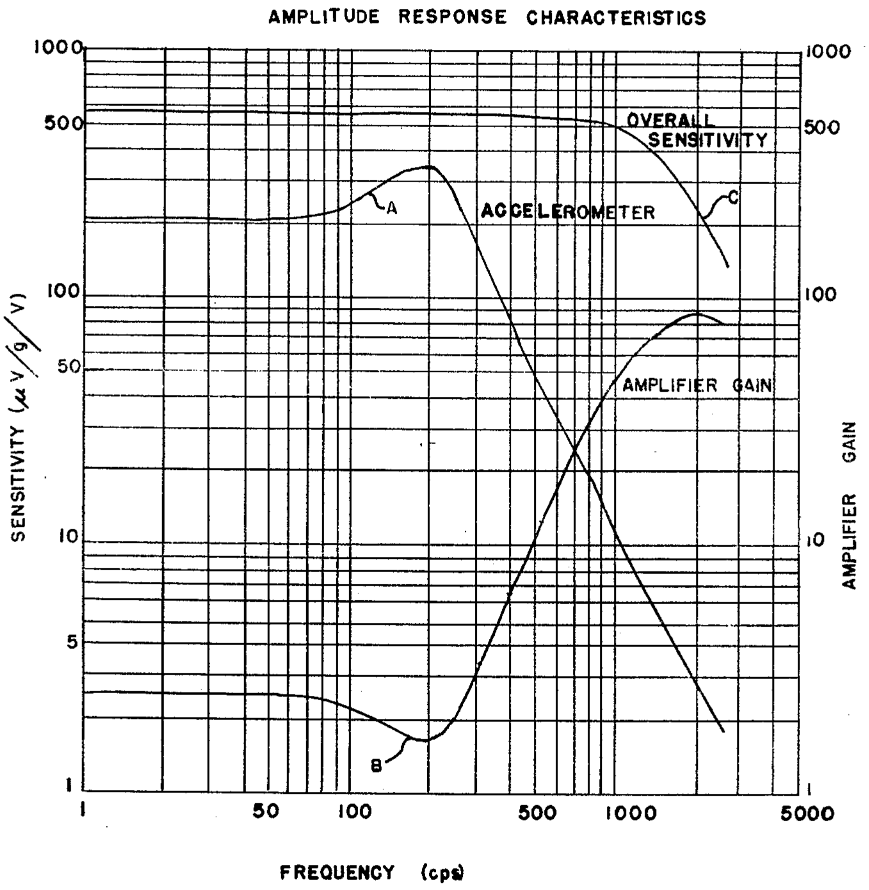
Fig. 6 is a set of curves showing the amplitude response characteristics of the accelerometer, amplifier and combined system.

Curve A of Fig. 6 indicates the variation of amplitude of the response with frequency of the accelerometer pickup device on a log-log scale. Curve B of Fig. 6 indicates the variation of amplitude of the response with frequency of the combined feedback amplifier and frequency corrective circuit on a log-log scale. Curve C of Fig. 6 indicates the variation of amplitude of the response with frequency of the combined accelerometer pickup, feedback amplifier and frequency corrective circuit on a log-log scale. Since curves A, B and C have ordinate scales which are logarithmic and since the combined response of the accelerometer pickup, feedback amplifier and frequency corrective circuit is equal to the product of the response of the accelerometer pickup and the combined response of the feedback amplifier and frequency corrective circuit, it is permissible to add the values of the ordinates of curve A and curve B to obtain curve C for any given frequency. Curve C represents the desired variation in amplitude response with frequency of an extended frequency range accelerometer having optimum damping.

Figure 7:
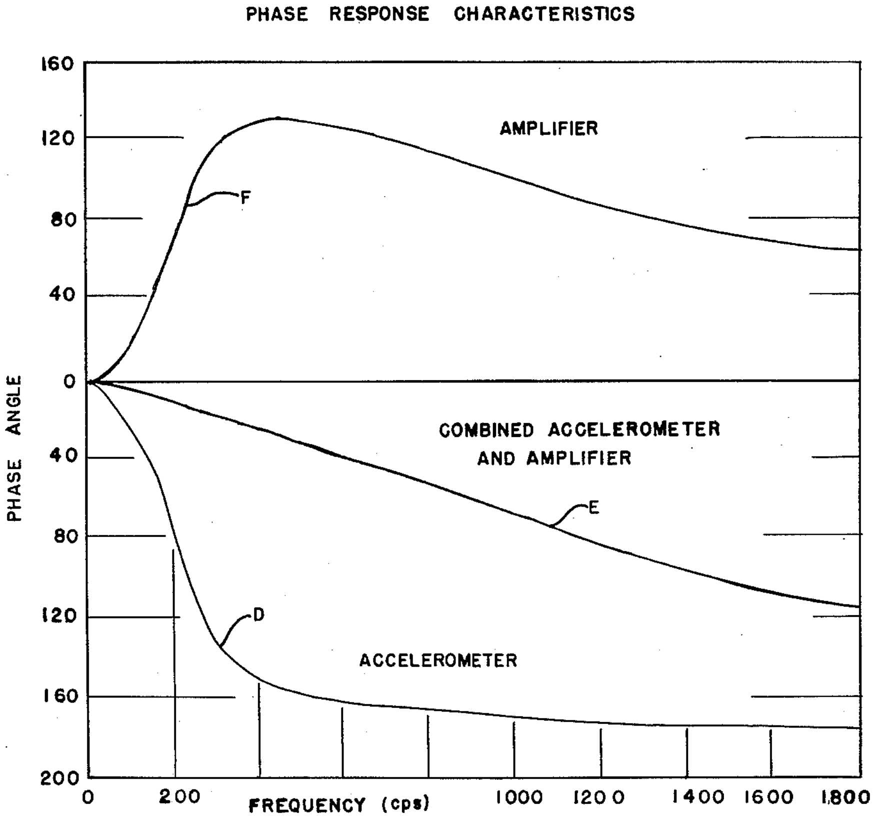
Fig. 7 is a set of curves showing the phase response characteristics of the accelerometer, amplifier and combined system.

In a corresponding manner, curve D of Fig. 7 indicates the variation in phase of the response with frequency of the accelerometer pickup. Curve E of Fig. 7 indicates the variation in phase of the response with frequency of the combined amplifier and frequency corrective network. Curve F of Fig. 7 indicates the variation in phase of the response with frequency of the combined accelerometer, feedback amplifier and frequency corrective circuit. Since curves D, E, and F of Fig. 7 have common scales and since the phase shift of the combined accelerometer pickup, feedback amplifier and frequency corrective circuit is equal to the sum of the phase shift of the accelerometer pickup and the phase shift of the combined feedback amplifier and corrective circuit, it is permissible to add the values of the ordinates of curves D and E to obtain curve F for any given frequency. Curve F represents the desired linear variation in phase response with frequency over the extended frequency range of interest for an accelerometer having obtimum damping.

It is deemed apparent from the foregoing graphical illustration of the desired resultant characteristics, and the manner and reasoning for combining same as verified by the mathematical analysis presented herein that the two separate component curves for amplitude and the analogous two curves for phase variations with frequency may advantageously be combined by the apparatus embodiment of the instant invention to achieve these improved extended frequency range, amplitude and phase operational characteristics in an accelerometer and connected amplifier combination.

While the invention has been described with reference to a single embodiment thereof which gives satisfactory results, it will be obvious to those skilled in the art to which the invention appertains, after understanding or appreciating the invention, that the same is susceptible of additional embodiments, modifications, and variations thereof without departing from the spirit and scope of the invention as defined by the appended claims.

What is claimed and desired to be secured by Letters Patent is:

1. In combination with an input device of predetermined uncorrected transfer characteristics with respect to a utilization circuit therefor, a feedback amplifier having the input thereof connected to said input device and comprising an analogue circuit in the feedback loop to the amplifier input, and a corrective circuit means connected outside of said feedback loop and to the output of said feedback amplifier, said corrective circuit means having amplitude and phase characteristics versus frequency correlative to the characteristics of said feedback loop and input device to provide a resulting combined output response which is flat throughout a useful operating frequency region appreciably extended over that of the said input device.

2. In combination with circuitry for providing a feedback corrected extended frequency range accelerometer, an amplifier circuit, an input amplifying tube, a frequency uncorrected strain-gage type accelerometer connected to said input tube of said amplifier, electron tube means providing a cathode follower output from said amplifier, an analogue circuit type frequency range extending filter network connected in series across said cathode follower output comprising series connected resistive, inductive, and capacitive elements, means for deriving a feedback signal from said analogue circuit thereof when a signal is fed thereto from the cathode follower output, said feedback signal voltage appearing across said capacitance element, means for applying the feedback voltage to the cathode of said input tube, and a second series connected resistance-inductance-capacitance network connected as a damping corrective network across said cathode follower output means and in shunt with said first named network, and means including a second cathode follower tube for deriving a low impedance output and providing frequency extended substantially constant amplitude response and linear phase shift for said circuitry through the extended useful frequency range of the combined accelerometer and feedback amplifier.

3. In combination, in circuitry for providing a feedback corrected extended frequency range characteristics for an accelerometer, an electronic amplifier circuit having at least an input stage and an output stage, a frequency uncorrected strain-gage type accelerometer connected to the input stage of said amplifier, circuit means providing a first cathode follower output from said output stage of said amplifier, a frequency range extending network providing characteristics of an analogue circuit for said accelerometer comprising resistance-inductance-capacitance network elements connected in series across said cathode follower output, means for deriving a corrective signal from said network when a signal is fed thereto from said cathode follower output, with the feedback signal thereof appearing across said capacitance element, means providing a second cathode follower stage connected to apply the feedback voltage signal to said input stage of said amplifying means, and a frequency correcting network providing constant amplitude and linear phase shift characteristics comprising series connected resistive, inductive, and capacitive elements connected in shunt with said first cathode follower output for damping the output of said amplifier to provide damping correction for the accelerometer characteristics and damping compensation for the effective feedback network whereby the overall output of said system provides an extended frequency range, substantially constant amplitude response, and linear phase shift through the extended frequency range of the combined accelerometer and feedback amplifier.

4. In combination in a feedback correcting circuit for appreciably extending the useful frequency range of an accelerometer, a multi-stage amplifier circuit, a frequency uncorrected strain gage type accelerometer having a plurality of strain sensitive resistance elements connected to the input stage of said amplifier in a bridge circuit relationship, electronic tube circuit means providing a cathode follower output from said amplifier, an analogue circuit connected as a frequency range extending network for said accelerometer having resistive, inductive and capacitive elements respectively arranged in series and applied in shunt across said cathode follower output, a frequency correcting network coupled to said first named network and comprising series connected resistive, inductive and capacitive elements connected in such a manner that the overall response is characterized by a constant amplitude and linear phase shift with frequency, means for deriving a feedback signal from said analogue circuit thereof when a signal is fed thereto from said cathode follower output, said feedback voltage signal appearing across said capacitance element of said analogue circuit, means for applying the feedback voltage signal as negative feedback to the input stage of said amplifier and means providing a signal from a portion of said corrective network which is effectively connected as a damping corrective and voltage divider network across said cathode follower output and in shunt with said first named network, and means providing an output stage for utilization of the signal from said signal providing means, said output means providing frequency extended substantially constant amplitude response and linear phase shift through the extended frequency range of the combined accelerometer and feedback amplifier.

5. In combination, an electronic amplifier, an accelerometer pickup device comprising a plurality of strain-sensitive resistive elements connected in a Wheatstone bridge circuit, a source of D.C. potential for energizing said bridge, said bridge circuit being connected to apply the output thereof to the grid of a first stage of said amplifier, said first amplifier stage comprising a tube having at least, cathode, grid and plate elements therein, a second stage of said amplifier resistance-capacitance coupled to said first stage by a network providing a predetermined time delay relationship therebetween, a third amplifier stage connected as a cathode follower output stage and coupled from said first stage by a resistance-capacitance coupling network having a time constant of predetermined difference from said first coupling network, an analogue type frequency range extending network connected in series across said cathode follower output which comprises series connected resistive, inductive and capacitive elements, means for deriving a feedback signal from said analogue circuit thereof when a signal is fed thereto by the cathode follower output, said feedback signal voltage appearing across said capacitance element, means including additional electronic tube means connected so as to provide a cathode follower output for feedback to the cathode of said input stage, and a second resistance-inductance-capacitance network series connected as a damping corrective network across said output and in shunt with said analogue network, and means for deriving an output from a portion of the signal appearing across said last named network.

6. In combination with a feedback corrected extended frequency range accelerometer system, an amplifying circuit means, a frequency uncorrected strain-gage type accelerometer connected to the input of said amplifier, an electron tube means comprising a cathode follower output from said amplifier, a frequency range extending network providing characteristics of an analogue circuit for said acceleratometer and comprising a resistance-inductance-capacitance network connected in series across said cathode follower output, means for deriving a feedback signal from said network as a signal is fed thereto from cathode follower output, said feedback signal appearing across said capacitance element, means including a cathode follower electron tube stage for applying the feedback voltage to said first stage of said amplifying means, a frequency correcting network comprising resistive, inductive and capacitive elements connected in series for damping the output of said amplifier, and to provide damping correction for the accelerometer characteristics and damping compensation for the effect of said first network, whereby the overall output of said system provides an extended useful frequency range, substantially constant amplitude response, and linear phase shift throughout the extended useful frequency range of the combined accelerometer and feedback amplifier system.

7. In combination with a feedback corrected extended range accelerometer system, an amplifier circuit, a frequency uncorrected strain-gage type accelerometer connected in a bridge circuit relation to the input stage of said amplifier circuit, amplifying circuit means providing a cathode follower output therefrom, a resistance-inductance-capacitance frequency range extending circuit connected across said cathode follower output, comprising respectively series connected resistive, inductive and capacitive elements, means for deriving a feedback signal from said extending circuit when a signal is applied thereto from the cathode follower output and derived across said capacitive element, means for applying the feedback voltage degeneratively to said input stage, a second series connected network connected as a damping corrective filter across said output and in shunt with said first named network, and means for deriving a low impedance output from said second network and providing frequency extended substantially constant amplitude response and linear phase shift through the extended useful frequency range of the combined accelerometer and feedback amplifier.

8. In combination with a feedback corrected extended range accelerometer system, an amplifier circuit, a frequency uncorrected detecting means connected to the input stage of said amplifier circuit, amplifying circuit means providing cathode follower output therefrom, a resistance-inductance-capacitance frequency range extending circuit connected across said cathode follower output, comprising respectively series connected resistive, inductive and capacitive elements, means for deriving a feedback signal from said extending circuit when a signal is applied thereto from the cathode follower output and derived across said capacitive element, means for applying the feedback voltage degeneratively to said input stage, a second series connected network connected as a damping corrective filter across said output and in shunt with said first named network, and means for deriving a low impedance output providing frequency extended substantially constant amplitude response and linear phase shift through the extended useful frequency range of the combined accelerometer and feedback amplifier.

9. In combination, a plurality of strain-sensitive elements connected in a Wheatstone bridge circuit, a source of D.C. potential for energizing said bridge to provide an accelerometer pickup device, a frequency corrective electronic amplifier, means connected to apply the output of said accelerometer derived from said bridge to the grid of a first electron tube stage of said amplifier, said first tube stage having at least cathode, grid and plate elements therein, a second tube stage of said amplifier coupled to the output of said first tube stage by a first resistance-capacitance coupling network providing a predetermined time delay relationship therebetween, a third tube stage connected to provide a cathode follower output and coupled to said second tube stage by a second resistance-capacitance coupling network having the time constant of the coupling network suitably staggered with respect to said first coupling network so as to stabilize the entire system, an analogue type frequency range extending network connected in series across said cathode follower output which comprises resistive, inductive and capacitive elements, means for deriving a feedback signal from said analogue circuit thereof when a signal is applied thereto by the cathode follower output, said feedback signal voltage appearing across the capacitance element, further means including an electron tube having the input thereof connected across said capacitance element to apply said feedback voltage thereto and to provide a cathode follower output for low impedance coupling of the feedback voltage to the cathode of said input stage, a second series connected resistance-inductance-capacitance network connected as a damping correcting network across said first cathode follower output and means deriving an output therefrom.

References Cited in the file of this patent

UNITED STATES PATENTS

| | | |
|---|---|---|
| 2,139,916 | Seeley | Dec. 13, 1938 |
| 2,383,888 | Price | Aug. 28, 1945 |
| 2,568,797 | Eland | Sept. 25, 1951 |
| 2,697,757 | John | Dec. 21, 1954 |
| 2,725,492 | Allan | Nov. 29, 1955 |
| 2,741,723 | Pacini | Apr. 10, 1956 |
| 2,811,591 | Kennedy | Oct. 29, 1957 |